United States Patent
Takagishi et al.

(10) Patent No.: US 8,125,744 B2
(45) Date of Patent: Feb. 28, 2012

(54) CURRENT PERPENDICULAR TO PLANE MAGNETO-RESISTANCE EFFECT ELEMENT, MAGNETIC HEAD, AND MAGNETIC RECORDING/REPRODUCING DEVICE

(75) Inventors: Masayuki Takagishi, Kunitachi (JP); Hitoshi Iwasaki, Yokosuka (JP); Masahiro Takashita, Yokohama (JP); Michiko Hara, Yokohama (JP); Dan Abels, San Francisco, CA (US); Xin Li, Milpitas, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 914 days.

(21) Appl. No.: 12/076,438

(22) Filed: Mar. 18, 2008

(65) Prior Publication Data
US 2008/0239586 A1 Oct. 2, 2008

(30) Foreign Application Priority Data
Mar. 28, 2007 (JP) ................. P2007-085440

(51) Int. Cl.
*G11B 5/39* (2006.01)
(52) U.S. Cl. .................................... 360/324.1
(58) Field of Classification Search ........ 360/324–324.2
See application file for complete search history.

(56) References Cited

U.S. PATENT DOCUMENTS
5,948,550 A * 9/1999 Fujii et al. ..................... 428/680
2001/0017753 A1 * 8/2001 Mori et al. ............... 360/324.12
2005/0190510 A1 * 9/2005 Funayama et al. ......... 360/324.1
2006/0034022 A1 2/2006 Fukuzawa et al.

FOREIGN PATENT DOCUMENTS
EP 1 626 393 A2 2/2006
JP 2006-054257 2/2006

OTHER PUBLICATIONS

M. Takagishi et al. "The Applicability of CPP-GMR Heads for Magnetic Recording"; IEEE Transaction on Magnetics. vol. 38, No. 5, Sep. 2002; pp. 2377-2382.

* cited by examiner

*Primary Examiner* — Will J Klimowicz
(74) *Attorney, Agent, or Firm* — Nixon & Vanderhye, P.C.

(57) ABSTRACT

A current perpendicular to plane magneto-resistance effect element includes: a magneto-resistance effect film comprised of a fixed magnetization layer, a free magnetization layer, and a complex spacer layer including an insulating layer and current paths formed through the insulating layer; a biasing mechanism for stabilizing the free magnetization layer; a shielding mechanism for ensuring a reproducing resolution of the magneto-resistance effect element; and a pair of electrodes for flowing a current perpendicular to a film surface of the magneto-resistance effect element; wherein a resistance area product (RA:$\Omega \times \mu m^2$) is set to $0.00062 \times \sqrt{(GAP)} \times TW + 0.06$ when a track width of the magneto-resistance effect element is defined as TW (nm) and a gap length of the magneto-resistance effect element is defined as GAP (nm).

14 Claims, 7 Drawing Sheets

CURRENT PERPENDICULAR TO PLANE MAGNETO-RESISTANCE EFFECT ELEMENT, MAGNETIC HEAD, AND MAGNETIC RECORDING/REPRODUCING DEVICE

CROSS-REFERENCE TO RELATED APPLICATIONS

This application is based upon and claims the benefit of priority from the prior Japanese Patent Application No. 2007-085440, filed on Mar. 28, 2007; the entire contents of which are incorporated herein by reference.

BACKGROUND OF THE INVENTION

1. Field of the Invention

The present invention relates to a magneto-resistance effect element which is configured such that a current is flowed in the direction perpendicular to the film surface thereof. The present invention also relates to a magnetic head and a magnetic recording/reproducing device which utilize the magneto-resistance effect element according to the present invention.

2. Description of the Related Art

As of now, a spin valve film (SV film) is widely available as a reproducing head for a hard disk drive (HDD). In this case, the reproduction is realized by utilizing Giant Magneto-resistive Effect (GMR) of the SV film and the biasing current is flowed parallel to the film surface of the SV film so as to constitute the SV film as a CIP (Current In-plane)-GMR film. The CIP-GMR film is made of a three-layered structure of a fixed magnetization layer of which the magnetization is fixed in one direction as reference, a free magnetization layer of which the magnetization is changed in accordance with an external magnetic field and a spacer layer disposed between the fixed magnetization layer and the free magnetization layer.

The free magnetization layer and the fixed magnetization layer are made of magnetic material such as Co, Ni, Fe and the spacer layer is made of non-magnetic conductor such as Cu, Ag, Au. Recently, there production is realized by utilizing Tunneling Magneto-resistive Effect (TMR) of the SV film and the biasing current is flowed perpendicular to the film surface of the SV film so as to constitute the SV film as a CPP (Current Perpendicular to plane)-TMR film. The CPP-TMR film is being mass-manufactured. Moreover, attention is paid to a CPP-GMR film in view of high density recording (Reference 1).

[Reference 1] IEEE Trans. Magn., Vol. 38, pp. 2277-, 2002

As described in Reference 1, it is required that the CPP-GMR film has an MR ratio (Magneto Resistive Ratio=resistance variation resistance) of at least about 3% in the HDD. In view of the enhancement of S/N, it is desired that CPP-GMR film has the MR ratio of 7% about twice as large as the required one of 3%. In the conventional CPP film, however, the MR ratio is within a range of 0.5 to 1.0% not to satisfy the above-described requirement. In this point of view, metal holes are formed in the spacer layer of the SV film to form the current-confined structure in the spacer layer in order to develop the MR ratio, that is, the S/N (Reference 2).

[Reference 2] JP-A 2006-54257 (KOKAI)

In Reference 2, the reproducing head has an MR ratio of 7.5% and a resistance area product (RA) of 0.6 $\Omega\mu m^2$. Then, the MR ratio is collated with the RA. The size of the reproducing head in the track direction is 70 nm, and the size of the reproducing head in the height direction is 70 nm, and the gap length of the reproducing head is 55 nm.

Figure 1:
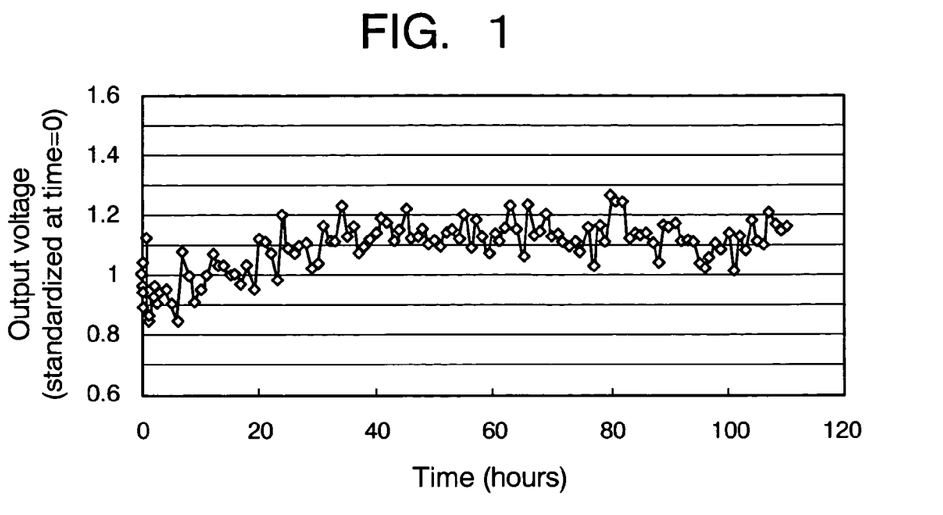
FIG. 1 is a graph showing the output fluctuation of a conventional CPP reproducing element.

If the reproducing head is employed by means of vertical recording under the biasing voltage of 120 mV, the output of the reproducing head becomes 1.6 mVpp within a lower frequency range and the S/N of the reproducing head becomes high. As shown in FIG. 1, however, the output voltage of the reproducing head is fluctuated randomly with time. In the case that the reproducing head is installed in the HDD, the AGC (Auto Gain Control) of the HDD may not operate if the output of the reproducing head is often fluctuated at a range of 10%. In this point of view, it is required that the standard deviation in output fluctuation of the reproducing head is reduced within a range of 5% or less.

BRIEF SUMMARY OF THE INVENTION

An aspect of the present invention relates to a current perpendicular to plane magneto-resistance effect element (first reproducing element), including: a magneto-resistance effect film comprised of a fixed magnetization layer of which a magnetization is fixed in one direction, a free magnetization layer of which a magnetization is changed in accordance with an external magnetic field, and a complex spacer layer including an insulating layer and current paths formed through the insulating layer; a biasing mechanism for stabilizing the free magnetization layer; a shielding mechanism for ensuring a reproducing resolution of the magneto-resistance effect element; and a pair of electrodes for flowing a current perpendicular to a film surface of the magneto-resistance effect element; wherein a resistance area product (RA:$\Omega\times\mu m^2$) is set to $0.00062\times\sqrt{(GAP)}\times TW+0.06$ when a track width of the magneto-resistance effect element is defined as TW (nm) and a gap length of the magneto-resistance effect element is defined as GAP (nm).

Another aspect of the present invention relates to a current perpendicular to plane magneto-resistance effect element (second reproducing element), including: a magneto-resistance effect film comprised of a fixed magnetization layer of which a magnetization is fixed in one direction, a free magnetization layer of which a magnetization is changed in accordance with an external magnetic field, and a complex spacer layer including an insulating layer and current paths formed through the insulating layer; a biasing mechanism for stabilizing the free magnetization layer; a shielding mechanism for ensuring a reproducing resolution of the magneto-resistance effect element; and a pair of electrodes for flowing a current perpendicular to a film surface of the magneto-resistance effect element; wherein a resistance area product (RA:$\Omega\times\mu m^2$) is set to $$RA(\Omega\times\mu m^2) \leq 0.14(\Omega\times\sqrt{\mu m})\times TW(nm)\times(1/\sqrt{(kBPI)})+0.06(\Omega\times\mu m^2)$$

when a track width of the magneto-resistance effect element is defined as TW(nm) and a gap length of the magneto-resistance effect element is defined as GAP(nm).

DETAILED DESCRIPTION OF THE INVENTION

Hereinafter, the present invention will be described in detail with reference to the drawings.

Figure 2:
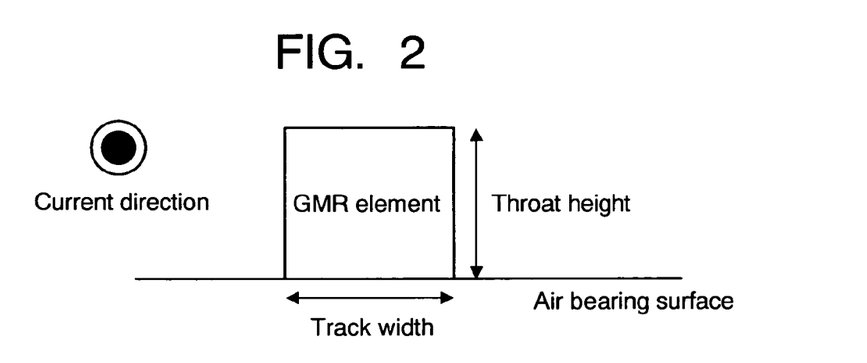
FIG. 2 is an explanatory view showing the area around a GMR element to be employed in a HDD.

The area around a GMR element to be employed in a HDD will be described. In this case, the GMR element is configured rectangular so that one surface of the GMR element is exposed to the air bearing surface (ABS) of a magnetic recording medium (refer to FIG. 2). The (physical) length of one side of the surface exposing to the ABS is called as a "track width (TW)". The length of another surface of the GMR element perpendicular to the ABS is called as a "throat height (SW)". The size of the GMR element at the top thereof is different from the size of the GMR element at the bottom thereof dependent on the manufacturing method so that the throat height (SW) are defined referring to the boundary between the fixed magnetization layer and the spacer layer which affects the reproducing width largely.

Figure 3:
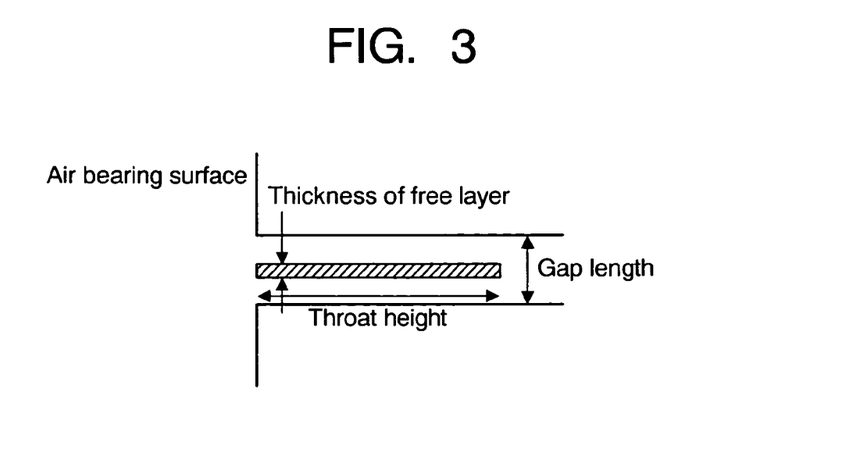
FIG. 3 is an also explanatory view showing the area around a GMR element to be employed in a HDD.

Then, the GMR element includes magnetic shields and the distance between the magnetic shields is called as a "gap length (GAP)" (refer to FIG. 3). With the magnetic head, the RA ($\Omega \times \mu m^2$) is defined by the reproducing resistance R and the element area A (TW×SH). In order to mitigate the above-described problems, the output fluctuation was estimated for a CCP-CPP-GMR element which can exhibit a reproducing output of 1.5 mV or more at the biasing voltage of 120 mV by changing the GAP, TW, SH and RA and using a vertical magnetic recording medium. As a result, it was turned out that the output fluctuation depends largely on the GAP, TW and RA.

Figure 4:
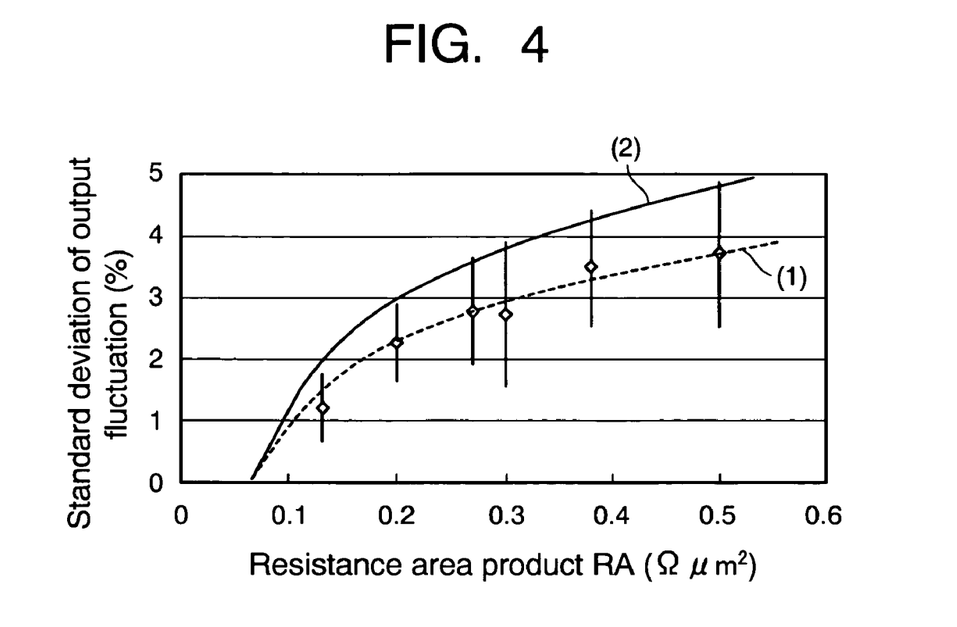
FIG. 4 is a graph showing the relation between the RA and the output fluctuation.
Figure 5:
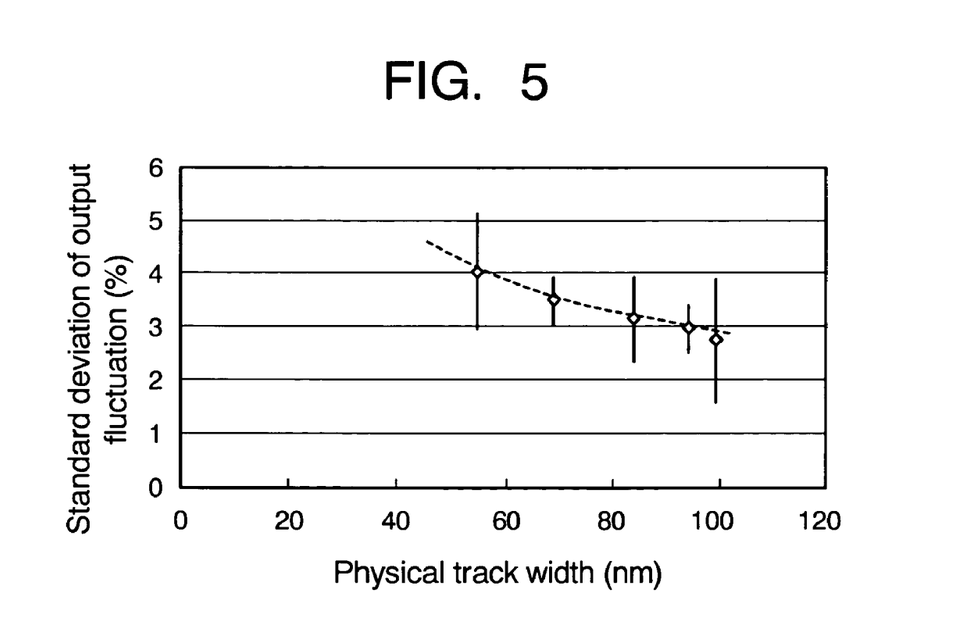
FIG. 5 is a graph showing the relation between the track width and the output fluctuation.
Figure 6:
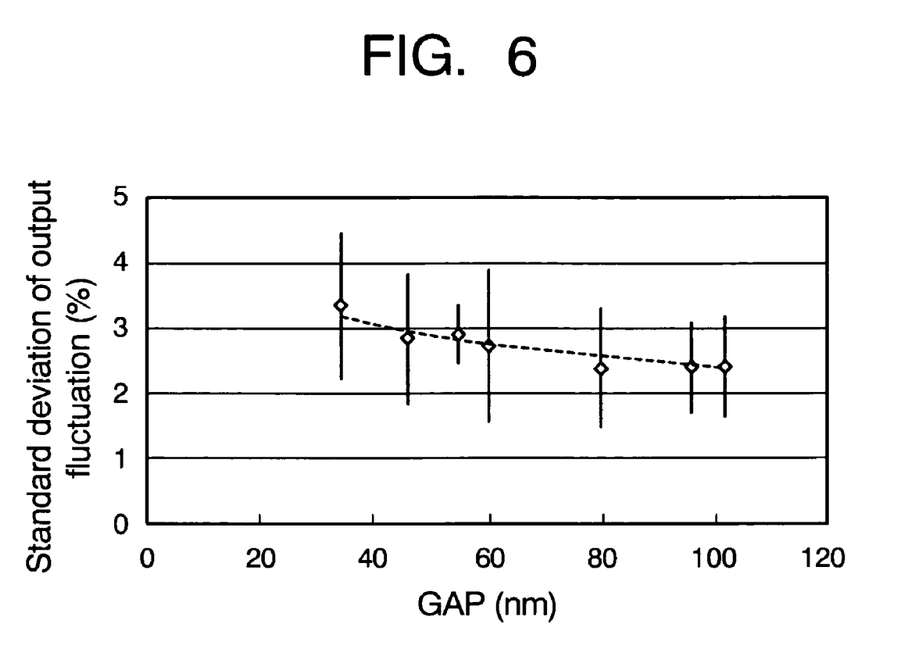
FIG. 6 is a graph showing the relation between the gap and the output fluctuation.

Concretely, the output fluctuation is in proportion to the half power of "RA-0.06 ($\Omega \times \mu m^2$)" (refer to the approximate curve (1) in FIG. 4). Then, the output fluctuation is in inverse proportion to the half power of "TW" (refer to FIG. 5). Then, the output fluctuation is in inverse proportion to the quarter power of "GAP" (refer to FIG. 6). In this point of view, the output fluctuation can be represented by the following equation:

$$\text{Output fluctuation} \propto \sqrt{\frac{RA - 0.06}{TW \times \sqrt{GAP}}} \quad (1)$$

Then, the averaged output fluctuation shown in FIG. 4 +1σ can be represented by the following equation:

$$\text{Averaged output fluctuation} + 1\sigma (\%) = 7.25 \times \sqrt{RA(\Omega \cdot \mu m^2) - 0.06} \quad (2)$$

(refer to the approximate curve (2) in FIG. 4). In this case, least squares method is also employed. Since the averaged GAP is 60 nm and the averaged TW is 99 nm, the equation (2) can be rewritten as the equation (3) using the equation (1).

$$\text{Averaged output fluctuation} + 1\sigma(\%) = \quad (3)$$
$$7.25 \times \sqrt{99(nm) \times \sqrt{60(nm)}} \times \sqrt{\frac{RA(\Omega \cdot \mu m^2) - 0.06}{TW(nm) \times \sqrt{GAP(nm)}}}$$

In order to set the output fluctuation of the magnetic head with the TW and GAP which are determined on the recording density within a range of 5%, in view of σ, the equation (3) satisfies the above-described range. Therefore, the equation (3) can be rewritten as the equation (4). In this case, the character "α" means the constant including the output fluctuation of 5% and is set to 0.00062. The unit of the RA is "$\Omega \cdot \mu m^2$", and the unit of the TW and GAP is "nm" (first reproducing element).

$$RA \leq \alpha \times TW \times \sqrt{(GAP)} + 0.06$$

$$RA(\Omega \times \mu m^2) \leq 0.00062(\Omega \times \sqrt{\mu m}) \times \sqrt{(GAP)(nm)} \times TW(nm) + 0.06(\Omega \times \mu m^2) \quad (4)$$

When the magnetic head is employed for the HDD, the GAP can be used twice as large as the minimum bit length. Therefore, the relation of $GAP(nm) = 2.54 \times 10^7 \div (kBPI \times 10^3) \times 2$ is substituted in the equation (4), and thus, the following equation (5) can be obtained:

$$RA(\Omega \times \mu m^2) \leq 0.14(\Omega \times \sqrt{\mu m}) \times TW(nm) \times (1/\sqrt{(kBPI)}) + 0.06(\Omega \times \mu m^2) \quad (5)$$

In this case, the output fluctuation can be suppressed within a range of 5% (second reproducing element). According to the aspect of the present invention, even though the low RA, which can not be considered conventionally, is employed, the output fluctuation can be suppressed, particularly for the CCP-CPP-GMR element.

Figure 7:
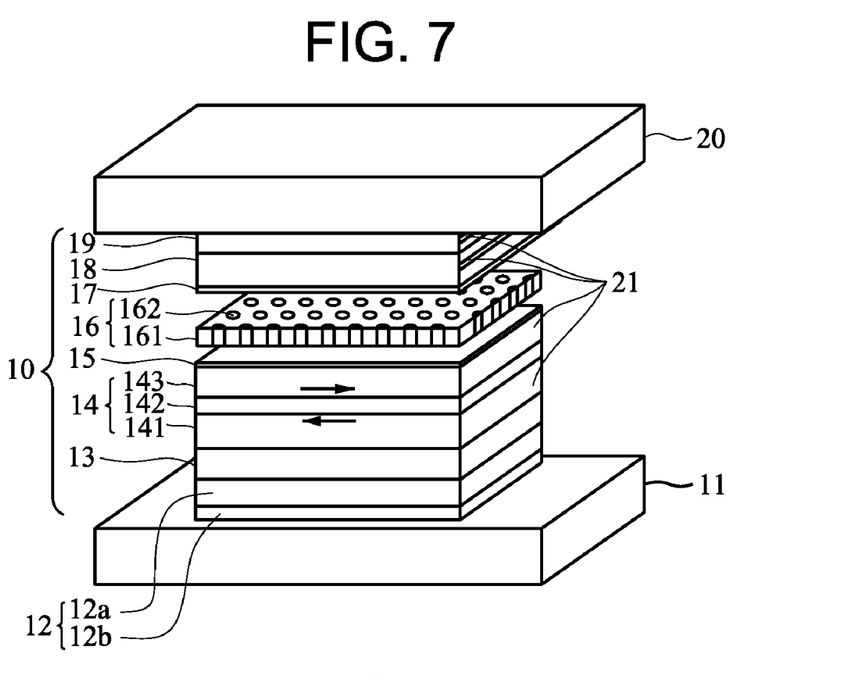
FIG. 7 is a perspective view showing a CPP magneto-resistance effect element according to an embodiment.

FIG. 7 is a perspective view illustrating a magneto-resistance effect element (CCP-CPP type element) according to an embodiment of the present invention. Some or all components throughout the drawings in the present application are schematically illustrated so that the illustrated thickness ratio for the components is different from the real thickness ratio for the components.

The magneto-resistance effect element illustrated in FIG. 7 includes a magneto-resistance effect element 10, a top electrode 20 and a bottom electrode 11 which are disposed so as to sandwich the magneto-resistance effect element 10. Herein, the illustrated stacking structure is formed on a base (not shown).

The magneto-resistance effect element 10 includes an underlayer 12, a pinning layer 13, a pinned layer 14, a bottom metallic layer 15, a CCP-NOL layer 16 (an insulating layer 161 and a current confining path 162), a top metallic layer 17, a free layer 18 and a cap layer 19 which are subsequently stacked and formed. The pinned layer 14, the bottom metallic layer 15, the CCP-NOL layer 16, the top metallic layer 17 and the free layer 18 constitute a spin valve film which is configured such that the non-magnetic spacer layer is sandwiched between the two ferromagnetic layers. For clarifying the structural feature of the magneto-resistance effect element, the CCP-NOL layer 16 is represented under the condition that the CCP-NOL layer 16 is separated from the upper and lower layers (the bottom metallic layer 15 and the top metallic layer 17).

The bottom electrode 11 and the top electrode 20 functions as a shielding mechanism so as to realize the reproducing performance. Not shown, a biasing mechanism such as hard magnetic layers is provided at both sides of the spin valve film so as to stabilize the free layer 18.

Then, the components of the magneto-resistance effect element will be described. The bottom electrode 11 functions as an electrode for flowing a current in the direction perpendicular to the spin valve film. In real, the current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently.

The underlayer 12 may be composed of a buffer layer 12a and a seed layer 12b. The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The seed layer 12b may be made of any material controllable for the crystalline orientation of (a) layer(s) to be formed thereon. For example, the seed layer 12b may be made preferably of a metallic layer with a fcc-structure (face-centered cubic structure), a hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. The crystalline orientation of the pinning layer 13 (e.g., made of PtMn) can be rendered an fct (111)-structure (face-centered tetragonal structure)-regulated orientation.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_XFe_{100-X}$: X=90 to 50%, preferably 75 to 85%) layer of a NiFe-based non-magnetic $((Ni_XFe_{100-X})_{100-Y}X_Y$: X=Cr, V, Nb, Hf, Zr, Mo)) layer. The crystalline orientation of the seed layer 12b of the NiFe-based alloy can be enhanced easily so that the FWHM in X-ray rocking curve can be rendered within a range of 3 to 5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR ratio can be realized even though the magneto-resistance effect element is downsized.

The crystal grain size of the spin valve film can be determined on the crystal grain size of the layer formed between the seed layer 12b and the spacer layer 16 by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

If the number of crystal grain per element area is decreased, the element characteristics may be fluctuated. In this point of view, it is not desired to enlarge the size of the crystal grain beyond a predetermined value. Particularly, with the CCP-CPP element with the current paths, it is not desired to enlarge the size of the crystal grain. On the other hand, too small grain size can not maintain the crystal orientation under good condition. In this point of view, it is desired that the crystal grain size is set within a range of 5 to 20 nm.

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn, NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

The pinning layer 13 may be made of a hard magnetic layer instead of the antiferromagnetic layer. For example, the pinning layer 13 may be made of CoPt (Co=50 to 85%), $(CoPt_{100-X})_{100-Y}Cr_Y$: X=50 to 85%, Y=0 to 40%) or FePt (Pt=40 to 60%). Since the hard magnetic layer has a smaller specific resistance, the Series resistance and the RA of the element can be reduced.

The pinned layer (fixed magnetization layer) 14 is formed as a synthetic pinned layer composed of the bottom pinned layer 141 (e.g., $Co_{90}Fe_{10}$), the magnetic coupling layer 142 (e.g., Ru) and the top pinned layer 143 (e.g., $Fe_{50}Co_{50}/Cu \times 2/Fe_{50}Co_{50}$). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes anti-paralleled to the direction of magnetization in the top pinned layer 143.

The bottom pinned layer 141 may be made of $Co_XFe_{100-X}$ alloy (X=0 to 100), $Ni_XFe_{100-X}$(X=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (Bs·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141.

For example, the top pinned layer 143 of $Fe_{50}Co_{50}/Cu\times2/Fe_{50}Co_{50}$ is employed. The top pinned layer 143 composes the spin dependent scattering unit. The top pinned layer 143 is a magnetic layer directly contributing the MR effect so that it is important to control the sort of material and the thickness of the top pinned layer 143 so as to enhance the MR change ratio because the top pinned layer 143 is formed as a magnetic layer adjacent to the CCP-NOL layer 16 and contributes the spin dependent interface scattering.

Then, the effect of the top pinned layer 143 made of $Fe_{50}CO_{50}$ with bcc-structure will be described. In this case, since the top pinned layer 143 can exhibit the large spin dependent interface scattering effect, the magneto-resistance effect element can exhibit the large MR effect. As the FeCo alloy with bcc structure, $Fe_XCo_{100-X}$ (X=30 to 100%) or $Fe_XCo_{100-X}$ with additive can be exemplified. Particularly, the FeCo alloy represented by $Fe_{40}CO_{60}$ through $Fe_{60}CO_{40}$ is preferable.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the large MR ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of the magnetic layers (FeCo layers) and the non magnetic layers (extremely thin Cu layers) which are alternately stacked respectively. In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non magnetic layer will be described. With the CCP-CPP element, since a current is confined in the vicinity of the current confining layer 16, the resistance in the vicinity of the current confining layer 16 contributes the total resistance of the magneto-resistance effect element. Namely, the resistance at the interface between the current confining layer 16 and the magnetic layers (pinned layer 14 and the free layer 18) contributes largely to the resistance of the magneto-resistance effect element. That means the contribution of the spin dependent interface scattering effect becomes large and important in the CCP-CPP element and thus, the selection of magnetic material located at the interface for the current confining layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR ratio.

The non-magnetic layer sandwiched by the magnetic layers may be made of Hf, Zr, Ti instead of Cu.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_XCo_{100-X})_{100-Y}Cu_Y$: X=30 to 100% Cr, Y=3 to 15%), but set to another composition range. The third element to be added to the main composition of FeCo may be selected from Hf, Zr, Ti instead of Cu.

The top pinned layer 143 may be also made of a single element such as Co, Fe, Ni or an alloy thereof.

Then, the spacer layer will be concretely described. The bottom metallic layer 15 is employed for the formation of the current confining path 162 and thus, functions as a supplier for the current confining path 162. It is not required that the metallic layer 15 remains as it is apparently after the formation of the current confining path 162. In this point of view, the bottom metallic layer 15 functions broadly as a part of the spacer layer. The bottom metallic layer 15 functions as a stopper layer preventing the oxidization of the magnetic layer 143 which is located below the current confining layer 16 in the formation of the current confining layer 16.

The CCP-NOL layer 16 includes the insulating layer 161 and the current confining path 162. The insulating layer 161 is made of oxide, nitride, oxynitride or the like. Concretely, the insulating layer 161 may be made of amorphous $Al_2O_3$ or crystal MgO. The CCP-NOL layer 16 constitutes the current-confined layer of the present invention.

Typically, the insulating layer 161 is made of $Al_2O_3$-based material, as occasion demands, containing an additive. As the additive, Ti, Hf, Mg, Zr, V, Mo, Si, Cr, Nb, Ta, W, B, C, V can be exemplified. The content of the additive may be set within a range of 0 to 50%.

The insulating layer 161 may be made of Ti oxide, Hf oxide, Mg oxide, Zr oxide, Cr oxide, Ta oxide, Nb oxide, Mo oxide Si oxide or V oxide instead of the Al oxide such as $Al_2O_3$. In this case, the additive as described above may be contained in the above-exemplified one. The content of the additive may be set within a range of 0 to 50%.

Instead of the oxide, the insulating layer 161 may be made of Al, Si, Hf, Ti, Mg, Zr, V, Mo, Nb, Ta, W, B, or C-based oxynitride or nitride only if the insulating layer 161 can exhibit the electric insulation.

The current confining path 162 functions as a path to flow a current in the direction perpendicular to the film surface of the CCP-NOL layer 16 and then, confining the current. The current confining path 162 also functions as a conductor to flow the current in the direction perpendicular to the film surface of the insulating layer 161 and is made of a metal such as Cu. In other words, the spacer layer 16 exhibits the current-confined path structure (CCP structure) so as to enhance the MR ratio from the current confining effect.

The current confining path 162 (CCP) may be made of Au, Ag, Ni, Co, Fe or an alloy containing at least one from the listed elements instead of Cu. In a preferred embodiment, the current confining path 162 is made of a Cu alloy. The current confining path 162 may be made of an alloy layer of CuNi, CuCo or CuFe. Herein, the content of Cu in the alloy is set preferably to 50% or over in view of the enhancement of the MR ratio and the reduction of the interlayer coupling field, Hin (interlayer coupling field) between the pinned layer 14 and the free layer 18.

The content in oxygen and nitrogen of the current confining path 162 is much smaller than (at least half as large as) the one of the insulating layer 161. The current confining path 162 is generally crystallized. Since the resistance of the crystalline phase is smaller than the resistance of the non-crystalline phase, the current confining path 162 can easily conduct the inherent function.

The top metallic layer 17 functions as a barrier layer protecting the oxidization of the free layer 18 to be formed thereon through the contact with the oxide of the current confining layer 16 so that the crystal quality of the free layer 18 cannot be deteriorated. When the insulating layer 161 is made of an amorphous material (e.g., $Al_2O_3$), the crystal quality of a metallic layer to be formed on the layer 161 may be deteriorated, but when an extremely thin layer (e.g., Cu layer with a thickness of 1 nm or less) to develop the crystal quality of fcc-structure is provided, the crystal quality of the free layer 18 can be remarkably improved.

The top metallic layer 17 may be not formed dependent on the sorts of material making the CCP-NOL layer 16 and the free layer 18. Concretely, if the materials making the insulating layer 161 of the CCP-NOL 16 and the free layer 18 are appropriately selected, the crystallinity of the CCP-NOL layer 16 is not deteriorated and thus, the top metallic layer 17 can be removed. If the annealing for the CCP-NOL layer 16 is appropriately conducted, the top metallic layer 17 can be also removed.

In view of the manufacturing margin, it is desired that the top metallic layer 17 is formed of e.g., a Cu layer with a thickness of 0.5 nm on the CCP-NOL layer 16.

The top metallic layer 17 may be made of Au or Ag instead of Cu. Then, it is desired that the top metallic layer 17 is made of the same material as the current confining path 162 of the CCP-NOL layer 16. If the top metallic layer 17 is made of a different material from the current confining path 162, the resistance at the interface between the top metallic layer 17 and the current confining path 162 is increased, but if the top metallic layer 17 is made of the same material from the current confining path 162, the resistance at the interface between the top metallic layer 17 and the current confining path 162 is not increased.

The free layer 18 is a ferromagnetic layer of which the direction of magnetization is varied commensurate with the external magnetic field. For example, the free layer 18 is made of a double-layered structure of $Co_{90}Fe_{10}/Ni_{83}Fe_{17}$. In order to realize the large MR ratio, it is desired to provide the CoFe alloy instead of the NiFe alloy. Then, in order to realize the large MR ratio, the selection of magnetic material of the free layer 18 in the vicinity of the spacer 16, that is, at the interface therebetween is important. The free layer 18 may be made of a single $CO_{90}Fe_{10}$ layer or a triple-layered structure of CoFe/NiFe/CoFe.

Among CoFe alloys, the $Co_{90}Fe_{10}$ layer is preferably employed in view of the stable soft magnetic property. Then, the free layer 18 is made of an alternately stacking structure of CoFe layers or Fe layers and extremely thin Cu layers.

In the case that the CCP-NOL layer 16 is made of the Cu layer, it is desired that the FeCo layer with bcc-structure is employed as the interface material thereof for the CCP-NOL layer 16 so as to enhance the MR ratio in the same manner as the pinned layer 14. As the FeCo layer with bcc-structure, the $Fe_xCo_{100-x}$ (X=30 to 100), as occasion demands, containing additive, may be employed.

The cap layer 19 functions as protecting the spin valve film. The cap layer 19 may be made of a plurality of metallic layers, e.g., a double-layered structure of Cu/Ru. The layered turn of the Cu layer and the Ru layer may be switched so that the Ru layer is located in the side of the free layer 18. The exemplified structure is particularly desired for the free layer 19 of NiFe because the magnetostriction of the interface mixing layer formed between the free layer 18 and the cap layer 19 can be lowered due to the non-solution between Ru and Ni.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the metallic layer because the kind of material of the cap layer may change the MR ratio and the long reliability. In view of the stable MR ratio and long reliability, the Cu layer and/or the Ru layer is preferable for the cap layer.

The top electrode 20 functions as flowing a current perpendicular to the film surface of the spin valve film. The current can be flowed perpendicular to the film surface of the spin valve film by applying a voltage between the bottom electrode 11 and the top electrode 20. The top electrode 20 may be made of material with low electric resistance (e.g., Cu or Au) (Apparatus to be employed for manufacturing a magneto-resistance effect element)

Figure 8:
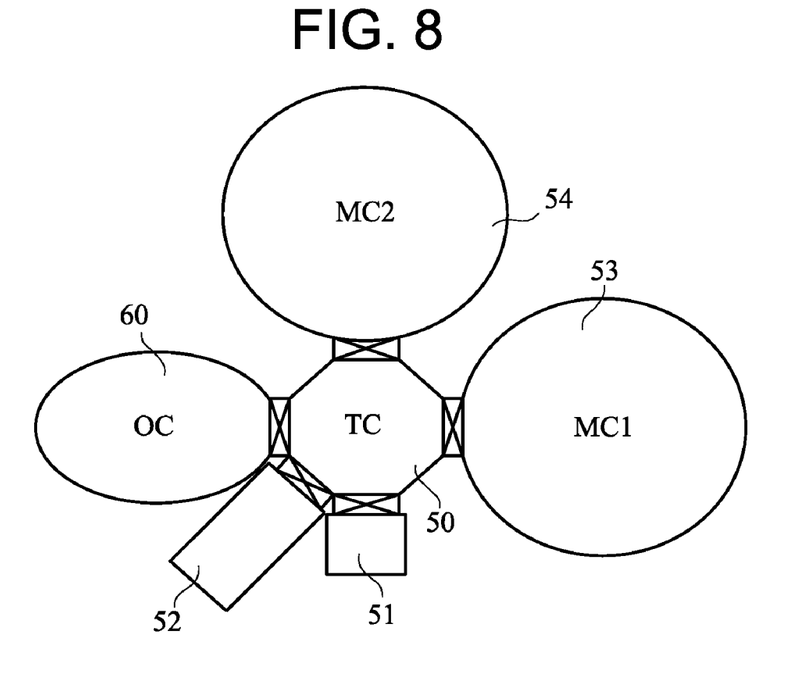
FIG. 8 is a schematic view illustrating a film forming apparatus for manufacturing the magneto-resistance effect element.

FIG. 8 is a schematic view illustrating a film forming apparatus for manufacturing a magneto-resistance effect element in this embodiment. As shown in FIG. 8, the transfer chamber (TC) 50 is disposed at the center of the apparatus such that the load lock chamber 51, the pre-cleaning chamber 52, the first metallic film-forming chamber (MC1) 53, the second metallic film-forming chamber (MC2) 54 and the oxide layer-nitride layer forming chamber (OC) 60 are disposed so as to be connected with the transfer chamber 50 via the gate valves, respectively. In the apparatus, the substrate on which various films are to be formed is transferred from one chamber from another chamber under the vacuum condition via the corresponding gate valve. Therefore, the surface of the substrate can be maintained clean.

The metallic film-forming chambers 53 and 54 include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.
(Schematic Explanation of the Method for Manufacturing a Magneto-Resistance Effect Element)

Hereinafter, the method for manufacturing a magneto-resistance effect element will be schematically described. First of all, on the substrate (not shown) are subsequently formed the bottom electrode 11, the underlayer 12, the pinning layer 13, the pinned layer 14, the bottom metallic layer 15, the spacer layer 16, the top metallic layer 17, the free layer 18, the cap layer 19 and the top electrode 20.

A substrate is set into the load lock chamber 51 so that some metallic films are formed in the metallic film-forming chambers 53 and 54 and some oxide and/or nitride layers are formed in the oxide layer-nitride layer forming chamber 60. The ultimate vacuum of the metallic film-forming chambers 53 and 54 is preferably set to $1 \times 10^{-8}$ Torr or below, normally within a range of $5 \times 10^{-10}$ Torr to $5 \times 10^{-9}$ Torr. The ultimate vacuum of the transfer chamber 50 is set in the order of $10^{-9}$ Torr. The ultimate vacuum of the oxide layer-nitride layer forming chamber 60 is set to $8 \times 10^{-8}$ Torr or below.
(1) Formation of Underlayer 12

The bottom electrode 11 is formed on the (not shown) substrate by means of micro-process in advance. Then, the underlayer 12 is formed as a layer of Ta/Ru on the bottom electrode 11. The Ta layer functions as the buffer layer 12a for relaxing the surface roughness of the bottom electrode 11. The Ru layer functions as the seed layer 12b for controlling the crystalline orientation and the size of crystal grain of the spin valve film to be formed thereon.

(2) Formation of Pinning Layer 13

Then, the pinning layer 13 is formed on the underlayer 12. The pinning layer 13 may be made of an antiferromagnetic material such as PtMn, PdPtMn, IrMn, RuRhMn.

(3) Formation of Pinned Layer 14

Then, the pinned layer 14 is formed on the pinning layer 13. The pinned layer 14 may be formed as the synthetic pinned layer of the bottom pinned layer 141 ($Co_{90}Fe_{10}$)/the magnetic coupling layer 142 (Ru)/the top pinned layer 143 ($Co_{90}Fe_{10}$).

(4) Formation of CCP-NOL Layer 16

Then, the CCP-NOL layer 16 is formed with the current confined structure (CCP structure) in the oxide layer-nitride layer forming chamber 60. The CCP-NOL layer 16 can be formed below.

First of all, a metallic layer m1 (e.g., made of Cu) as a supplier for the current confining paths is formed on the top pinned layer 143 (or the functional layer), and a metallic layer m2 (e.g., AlCu or Cu) to be converted into the corresponding insulating layer is formed on the metallic layer m1.

Then, the conversion treatment is performed onto the metallic layer m2 by oxidizing or nitriding. Moreover, the conversion treatment can be performed through a plurality of steps. For example, in the first step, the ion beams of inert gas such as Ar are irradiated. The irradiation of ion beams corresponds to a pre-treatment for the formation of the CCP-NOL layer 16, and is called as a "PIT (Pre-ion treatment)". According to the PIT, the elements of the metallic layer m1 are pumped up and infiltrated into the metallic layer m2. Therefore, the PIT is effective as an energy treatment.

As the energy treatment, thermal treatment may be employed. In this case, the metallic layers m1 and m2 are heated within a range of 100 to 300° C. Moreover, after the metallic layer m2 is converted into the corresponding insulating layer 161 by the exposure of oxygen gas, the energy treatment using the ion beam irradiation of Ar or the like may be conducted onto the insulating layer 161 (metallic layer m2). The post-treatment is called as an "AIT (Ion-beam assisted oxidation)".

The Cu element of the metallic layer m1 are pumped up into the metallic layer m2 (insulating layer 161) made of e.g., AlCu.

In addition to the PIT treatment, the oxidizing or the nitriding can be conducted under the energy assist using the ion beams. The energy assisted treatment is called as an "IAO (Ion-beam assisted oxidation)".

With the PIT treatment and the AIT treatment, the ion beams of Ar are irradiated under the condition that the accelerating voltage is set within a range of 30 to 150 V, and the beam current is set within a range of 20 to 200 mA and the treatment period is set within a range of 30 to 180 seconds. The accelerating voltage is preferably set within a range of 40 to 60 V. In the case that the accelerating voltage is beyond the range, the MR variation ratio may be decreased due to the surface roughness of the layer(s) constituting the magneto-resistance effect element after the PIT treatment or the AIT treatment. The beam current is preferably set within a range of 30 to 80 mA and the irradiation period is set within a range of 60 to 150 seconds.

Moreover, the metallic layer m2 may be formed by means of biasing sputtering instead of the PIT or AIT. The sputtering energy may be set within a range of 30 to 200 V in the DC biasing sputtering and within a range of 30 to 200 W in the RF biasing sputtering.

With the IAO, the accelerating voltage is set within a range of 40 to 200 V, and the beam current is set within a range of 30 to 200 mA, and the treatment period is set within a range of 15 to 300 seconds under the use of Ar ion beams. In the case that the accelerating voltage is beyond the range, the MR variation ratio may be decreased due to the surface roughness of the layer(s) constituting the magneto-resistance effect element after the PIT treatment. The beam current is preferably set within a range of 40 to 100 mA and the irradiation period is set within a range of 30 to 180 seconds.

With the IAO, the oxygen gas is preferably supplied within a range of 1000 to 3000 L (Langmuir). If the pinned layer 14 is oxidized in addition to the metallic layer m2, e.g., made of Al, the heat-resistance and reliability of the magneto-resistance effect element is deteriorated. In view of the enhancement of the reliability of the magneto-resistance effect element, it is important that the pinned layer 14 is not oxidized so that the metallic characteristics can be maintained. In this point of view, the oxygen supplying amount is set within the above-described range.

In order to convert the metallic layer m2 stably into the corresponding insulating layer, it is desired that the oxygen gas is supplied only during the irradiation of the ion beams. Namely, when the ion beams are not irradiated, the oxygen gas is not supplied.

The CPP-NOL layer 16 made of the insulating layer 161, e.g., made of $Al_2O_3$ and the current metal paths 162, e.g., made of Cu is formed through the above-described oxidizing treatment. In this case, since the current metal paths 162 are made of Cu not subject to the oxidizing in comparison with Al, the current metal paths 162 can be maintained as they are.

(5) Formation of Free Layer 18

The sort of magnetic material of the free layer 18, located at the interface for the CPP-NOL layer 16, is appropriately selected so as to realize the large MR change ratio. The portion of the free layer 18 adjacent to the interface for the CPP-NOL layer 16 is preferably made of CoFe alloy, not NiFe alloy. As the CoFe alloy, $Co_{90}Fe_{10}$ alloy may be preferably employed due to the stable soft magnetism. However, another CoFe alloy may be employed.

In order to develop the spin dependent interface scattering effect, the free layer 18 may be made of $Fe_{50}CO_{50}$ (or $Fe_XCo_{100-X}$ (X=45 to 85). In this case, if the thickness of the free layer 18 is increased beyond a predetermined value, the free layer 18 may not exhibit the soft magnetism.

Since NiFe alloy can exhibit a larger soft magnetism than the CoFe alloy, the free layer 18 can exhibit the soft magnetism sufficiently when the free layer 18 is made of CoFe/NiFe layer. When the free layer 18 is made of the NiFe alloy, the portion of the free layer 18 adjacent to the interface for the CPP-NOL layer 16 can be made of a material which can exhibit the large MR change ratio, which is desired in view of the MR change ratio of the magneto-resistance effect element.

The NiFe alloy can be preferably represented by $Ni_XFe_{100-X}$ (X=78 to 85%). Particularly, the Ni-rich NiFe alloy, in comparison with the normal $Ni_{81}Fe_{19}$ alloy, is preferably employed. As the Ni-rich NiFe alloy, the $Ni_{83}Fe_{17}$ alloy can be exemplified so as to realize non-magnetostriction of the free layer 18. The magnetostriction of the NiFe layer formed on the CCP-NOL layer 16 is shifted positive relatively in comparison with the magnetostriction of the NiFe layer formed on the Cu spacer layer. On the other hand, the magnetostricton of the Ni-rich NiFe alloy is shifted negative. Therefore, if the Ni-rich NiFe alloy is employed, the inherent positive shift of the magnetostriction of the NiFe alloy caused by the formation on the CCP-NOL layer can be cancelled by the negative shift of the magnetostricton of the Ni-rich NiFe alloy.

(6) Formation of Cap Layer 19 and Top Electrode 20

The cap layer 19 is formed as a multilayer of Cu/Ru on the free layer 18. Then, the top electrode 20 is formed on the cap layer 19 so as to flow a current to the spin valve film in the direction perpendicular to the film surface thereof.

EXAMPLES

The present invention will be described in detail in view of Examples.

Example 1

In Example 1, the magnetic head with the gap length of 55 nm and the track width of 120 nm was manufactured. The insulating layer of the CCP-CPP-GMR film was made of AlOx containing Cu. In this case, the magnetic head can exhibit a line recording density of 920 kBPI and a track recording density of 125 kTPI so as to exhibit a recording density of about 115 Gbpsi. In this Example, the head output was estimated by reading out the difference in resistance of the magnetic head when a constant static magnetic field of +/−400 Oe is introduced into the magnetic head from through the gap thereof. Therefore, the real head output was not read out. The constant static magnetic field of +/−400 Oe corresponds to the magnetic field at the low frequency signal readout from a vertical recording medium.

Figure 9:
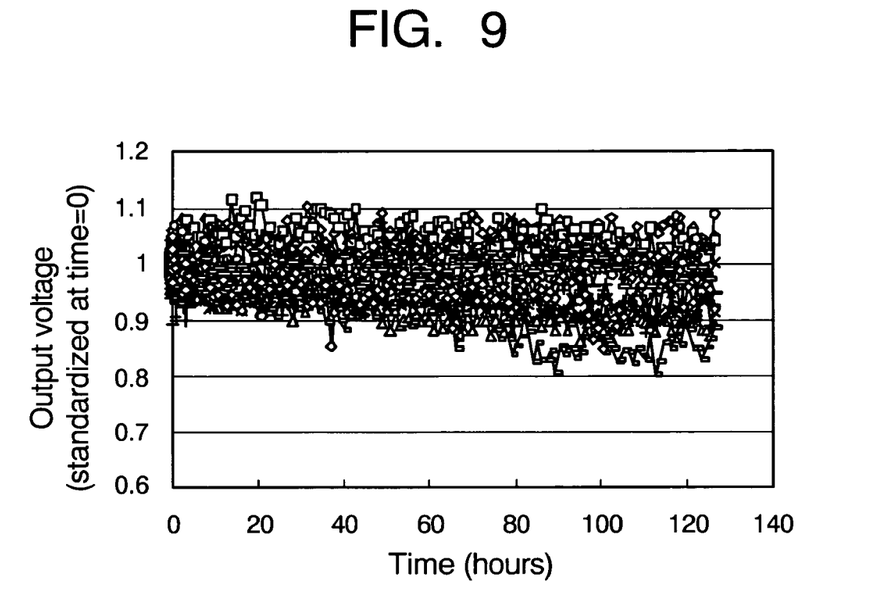
FIG. 9 is a graph showing the output fluctuation of the CPP magneto-resistance effect element in Example 1.

The magnetic head was also configured such that the output was set to 1.5 mV or more at the application of the sensing bias of 120 mV so as to recognize the S/N of the magnetic head when the magnetic head was installed in an HDD. The environmental temperature was set to 130° C. more than the working temperature. In this case, the upper limit of the RA of the magnetic head is 0.61 $\Omega\mu m^2$ by substituting the gap length of 55nm and the track width of 120 nm into the equation (4). In this Example, the RA of the magnetic head was set to 0.38 $\Omega\mu m^2$. In ten magnetic head samples, the average output fluctuation was 3.03% and the standard deviation was 0.91% so that the characteristic fluctuation was within a range of 5% (refer to FIG. 9).

Example 2

Figure 10:
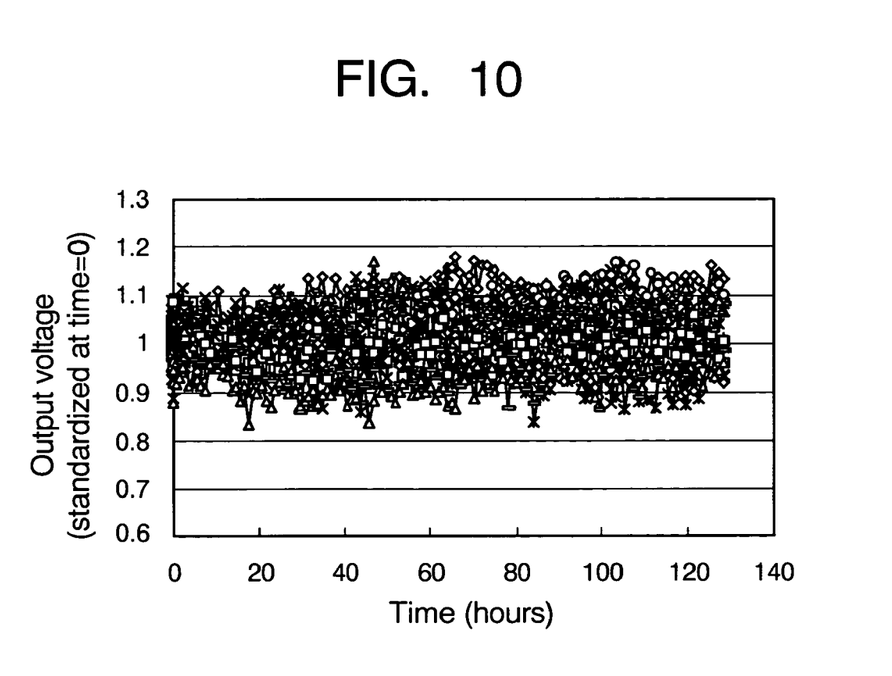
FIG. 10 is another graph showing the output fluctuation of the CPP magneto-resistance effect element in Example 2.

In Example 2, the magnetic head with the gap length of 40 nm and the track width of 50 nm was manufactured. In this case, the magnetic head can exhibit a line recording density of 1300 kBPI and a track recording density of 300 kTPI so as to exhibit a recording density of about 400 Gbpsi. In this case, the upper limit of the RA of the magnetic head is 0.26 $\Omega\mu m^2$ by substituting the gap length of 40 nm and the track width of 50 nm into the equation (4). In this Example, the RA of the magnetic head was set to 0.20 $\Omega\mu m^2$. In 13 magnetic head samples, the average output fluctuation was 4.08% and the standard deviation was 0.72% so that the characteristic fluctuation was within a range of 5% (refer to FIG. 10).

Example 3

Figure 11:
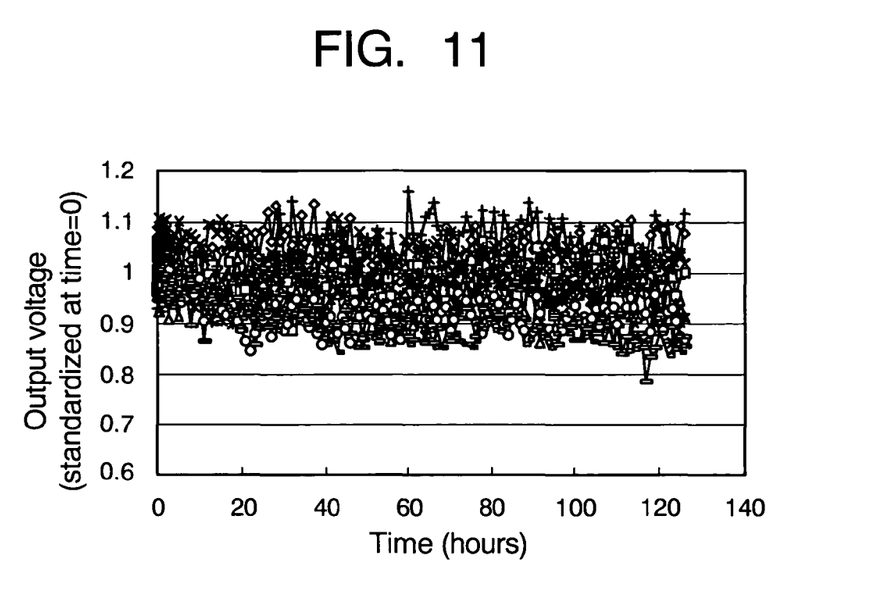
FIG. 11 is still another graph showing the output fluctuation of the CPP magneto-resistance effect element in Example 3.

In Example 3, the magnetic head with the gap length of 40 nm and the track width of 50 nm was manufactured as in Example 2. In this case, the magnetic head can exhibit a recording density of about 400 Gbpsi. In this case, the upper limit of the RA of the magnetic head is 0.21 $\Omega\mu m^2$ by substituting the gap length of 40 nm and the track width of 50 nm into the equation (4). In this Example, the RA of the magnetic head was set to 0.22 $\Omega\mu m^2$. In nine magnetic head samples, the average output fluctuation was 4.18% and the standard deviation was 0.59% so that the characteristic fluctuation was within a range of 5% (refer to FIG. 11).

Comparative Example

Figure 12:
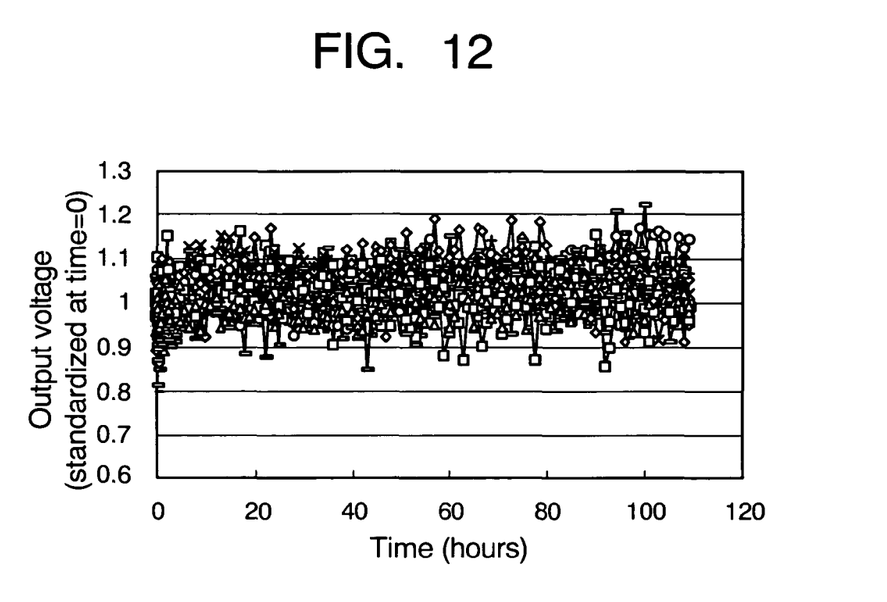
FIG. 12 is a graph showing the output fluctuation of the CPP magneto-resistance effect element in the Comparative Example.

In the Comparative Example, the magnetic head with the gap length of 40 nm and the track width of 60 nm was manufactured. In this case, the magnetic head can exhibit a line recording density of 1300 kBPI and a track recording density of 250 kTPI so as to exhibit a recording density of about 320 Gbpsi. In this case, the upper limit of the RA of the magnetic head is 0.30 $\Omega\mu m^2$ by substituting the gap length of 40 nm and the track width of 60 nm into the equation (4). In this Comparative Example, the RA of the magnetic head was set to 0.40 $\Omega\mu m^2$ beyond the upper limit of 0.30 $\Omega\mu m^2$. In 11 magnetic head samples, the average output fluctuation was 5.07% and the standard deviation was 1.36% so that the characteristic fluctuation was beyond a range of 5% (refer to FIG. 12).

EFFECT OF THE INVENTION

The upper limit of the RA are listed in Table 1 when the recording density is varied within a range of 130 to 1900 Gbpsi. When the magnetic head (CCP-CPP-GMR element) with the higher range of the recording density is installed in the HDD, the characteristic fluctuation can be reduced within a range of 5% by controlling the RA so as to satisfy the equations (2) and (3). The characteristic fluctuation within a range of 5% can not affect the reliability of the HDD.

TABLE 1

| Gbpsi | kBPI | kTPI | GAP | TW | RA |
|---|---|---|---|---|---|
| 130 | 850 | 150 | 60 | 100 | 0.54 |
| 190 | 980 | 190 | 52 | 80 | 0.42 |
| 300 | 1200 | 250 | 43 | 60 | 0.30 |
| 600 | 1550 | 380 | 33 | 40 | 0.20 |
| 750 | 1700 | 440 | 30 | 35 | 0.18 |
| 1900 | 2500 | 760 | 20 | 20 | 0.12 |

(Magnetic Recording/Reproducing Device)

Then, the magnetic recording/reproducing device according to an embodiment will be described. The magneto-resistance effect element as described above is installed in advance in an all-in-one magnetic head assembly allowing both the recording/reproducing, and mounted as the head assembly at the magnetic recording/reproducing device.

Figure 13:
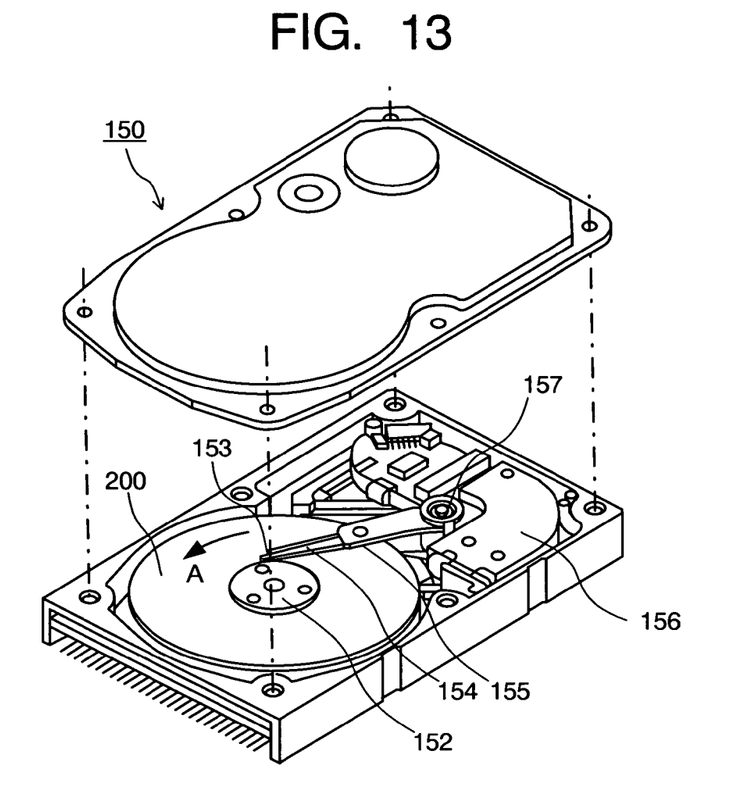
FIG. 13 is a perspective view illustrating an essential part of a magnetic recording/reproducing device according to the present invention.

FIG. 13 is a perspective view illustrating the schematic structure of the magnetic recording/reproducing device. The magnetic recording/reproducing device 150 illustrated in FIG. 13 constitutes a rotary actuator type magnetic recording/reproducing device. In FIG. 13, a magnetic recording disk 200 is mounted to a spindle 152 to be turned in the direction designated by the arrow A by a motor (not shown) which is driven in response to control signals from a drive unit controller (not shown). In FIG. 13, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200. The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 14:
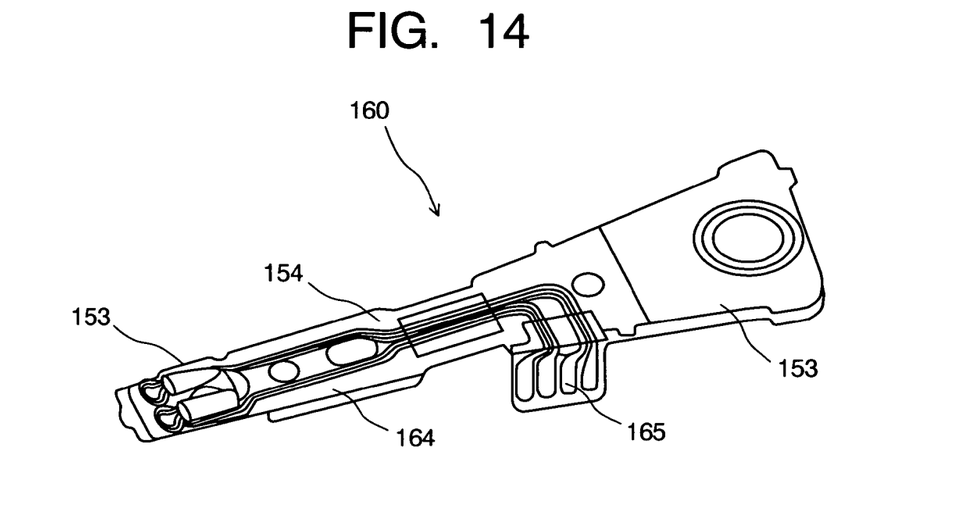
FIG. 14 is an enlarged perspective view illustrating the magnetic head assembly of the magnetic recording/reproducing device as viewed from a magnetic recording disk.

FIG. 14 is an enlarged perspective view illustrating a portion of the magnetic head assembly positioned at the tip side thereof from the actuator arm 155, as viewed from the side of the magnetic recording disk 200. As illustrated in FIG. 14, the magnetic head assembly 160 has the actuator arm 155 with the bobbin portion supporting the driving coil and the like. The suspension 154 is connected with the one edge of the actuator arm 155.

Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 13 and 14, since the magneto-resistance effect element as described in the above embodiments is installed, the information magnetically recorded in the magnetic recording disk 200 under higher density recording than normal recording can be read out properly.

ANOTHER EMBODIMENT

Although the present invention was described in detail with reference to the above examples, this invention is not limited to the above disclosure and every kind of variation and modification may be made without departing from the scope of the present invention.

The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element according to the present invention can be obtained so as to exhibit the same effect/function as described above.

When the magneto-resistance effect element is applied for a reproducing magnetic head, the detecting resolution of the magnetic head can be defined by applying magnetic shielding for the upper side and the lower side of the magneto-resistance effect element. Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

The magnetic head and the magnetic recording/reproducing device can be modified for another magneto-resistance effect element, magnetic head, magnetic recording/reproducing device and magnetic memory within the scope of the present invention.

What is claimed is:

1. A current perpendicular to plane magneto-resistance effect element, comprising:
   a magneto-resistance effect film comprised of a fixed magnetization layer of which a magnetization is fixed in one direction, a free magnetization layer of which a magnetization is changed in accordance with an external magnetic field, and a complex spacer layer including an insulating layer and current paths formed through said insulating layer;
   a biasing mechanism for stabilizing said free magnetization layer;
   a shielding mechanism for ensuring a reproducing resolution of said magneto-resistance effect element; and
   a pair of electrodes for flowing a current perpendicular to a film surface of said magneto-resistance effect element,
   wherein a resistance area product ($RA: \Omega \times \mu m^2$) is set to $RA$ ($\Omega \times \mu m^2$) $\leq 0.00062(\Omega \times \sqrt{\mu m}) \times \sqrt{(GAP)(nm)} \times TW(nm) + 0.06(\Omega \times \mu^2)$ when a track width of said magneto-resistance effect element is defined as TW and a gap length of said magneto-resistance effect element is defined as GAP.

2. The element as set forth in claim 1,
   wherein said shielding mechanism includes said pair of electrodes.

3. The element as set forth in claim 1,
   wherein said biasing mechanism includes hard magnetic layers which are disposed at both sides of said magneto-resistance effect film.

4. The element as set forth in claim 1,
   wherein a crystal grain size of said magneto-resistance effect element is set within a range of 5 to 40 nm.

5. The element as set forth in claim 4,
   wherein a crystal grain size of said magneto-resistance effect element is set within a range of 5 to 20 nm.

6. A magnetic head comprising a current perpendicular to plane magneto-resistance effect element as set forth in claim 1.

7. A magnetic recording/reproducing device comprising a magnetic recording medium and a magnetic head as set forth in claim 6.

8. A current perpendicular to plane magneto-resistance effect element, comprising:
   a magneto-resistance effect film comprised of a fixed magnetization layer of which a magnetization is fixed in one direction, a free magnetization layer of which a magnetization is changed in accordance with an external magnetic field, and a complex spacer layer including an insulating layer and current paths formed through said insulating layer;
   a biasing mechanism for stabilizing said free magnetization layer;
   a shielding mechanism for ensuring a reproducing resolution of said magneto-resistance effect element; and
   a pair of electrodes for flowing a current perpendicular to a film surface of said magneto-resistance effect element, wherein a resistance area product (RA:Ω×μm²) is set to RA(Ω×μm²)≦0.14(Ω×√μm)×TW(nm)×(1/√(kBPI))+0.06(Ω×μm²) when a track width of said magneto-resistance effect element is defined as TW, a gap length of said magneto-resistance effect element is defined as GAP and GAP=2.54×10⁷÷(kBPI×10³)×2.

9. The element as set forth in claim 8,
wherein said shielding mechanism includes said pair of electrodes.

10. The element as set forth in claim 8,
wherein said biasing mechanism includes hard magnetic layers which are disposed at both sides of said magneto-resistance effect film.

11. The element as set forth in claim 8,
wherein a crystal grain size of said magneto-resistance effect element is set within a range of 5 to 40 nm.

12. The element as set forth in claim 11,
wherein a crystal grain size of said magneto-resistance effect element is set within a range of 5 to 20 nm.

13. A magnetic head comprising a current perpendicular to plane magneto-resistance effect element as set forth in claim 8.

14. A magnetic recording/reproducing device comprising a magnetic recording medium and a magnetic head as set forth in claim 13.

* * * * *